Figure 1:
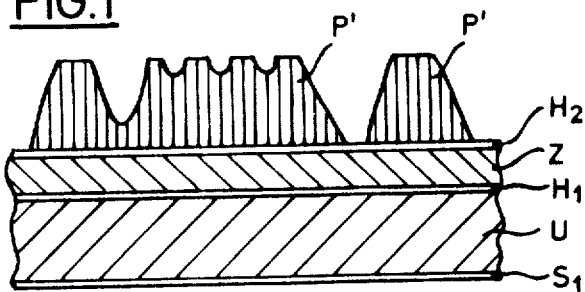

United States Patent [19]
Zuerger et al.

[11] 3,990,897
[45] Nov. 9, 1976

[54] LAMINATES FOR THE MANUFACTURE OF RELIEF PRINTING PLATES

[75] Inventors: Manfred Zuerger, Mannheim; Albert Elzer; Peter Richter, both of Ludwigshafen; August Wigger, Waldsee; Heinz-Ulrich Werther, Wachenheim, all of Germany

[73] Assignee: BASF Aktiengesellschaft, Ludwigshafen (Rhine), Germany

[22] Filed: Oct. 22, 1974

[21] Appl. No.: 516,881

[30] Foreign Application Priority Data
Sept. 14, 1974 Germany............... 2444118

[52] U.S. Cl. .................... 96/67; 96/35.1; 96/36.3; 96/86 P; 96/87 R; 96/115 P; 101/150; 101/395; 101/401.1; 101/456

[51] Int. Cl.² ............... G03C 1/94; G03C 1/68; G03C 1/80; G03F 7/00

[58] Field of Search ............... 96/36.3, 115 P, 67, 96/35.1, 86 P, 87 R; 101/401.1, 456, 457, 467, 465, 453, 395, 150

[56] References Cited
UNITED STATES PATENTS

| | | |
|---|---|---|
| 2,760,863 | 8/1956 | Plambeck, Jr. ............ 96/36.3 X |
| 3,024,180 | 3/1962 | Mc Graw ............ 96/36.3 UX |
| 3,202,513 | 8/1965 | Thommes ............ 96/36.3 X |
| 3,271,149 | 9/1966 | Starch et al. ............ 96/36.3 X |
| 3,356,501 | 12/1967 | Tongs ............ 96/36.3 X |
| 3,479,182 | 11/1969 | Chu ............ 96/36.3 X |
| 3,764,324 | 10/1973 | Reyes ............ 96/36.3 X |

Primary Examiner—William A. Powell
Assistant Examiner—Thomas Bokan
Attorney, Agent, or Firm—Johnston, Keil, Thompson & Shurtleff

[57] ABSTRACT

The invention relates to relief plates for flexographic printing comprising a relatively soft elastomeric base (U) having a modulus of elasticity of from 10 to 200 kg/cm² and a thickness of from 0.5 to 6 mm and, firmly bonded thereto, a thin, relatively hard, difficultly soluble intermediate layer Z having a modulus of elasticity of from $1 \times 10^3$ to $2.1 \times 10^6$ kg/cm² and a thickness of from 5 to 500 $\mu$ and, firmly bonded to said intermediate layer Z, a relief layer P' consisting of a photocrosslinked elastomeric mixture having a modulus of elasticity of from 30 to 2000 kg/cm² and a thickness of from 200 to 300 $\mu$, the modulus of elasticity of the photocrosslinked relief layer P' being the same as or higher than that of the base U and the neutral surface of the relief plate lying in or near the intermediate layer Z. The invention also relates to photosensitive laminates for the production of such plates.

6 Claims, 4 Drawing Figures

LAMINATES FOR THE MANUFACTURE OF RELIEF PRINTING PLATES

The present invention relates to relief printing plates and to laminates for the manufacture of photopolymer relief plates for flexographic printing by imagewise exposure of the photo-crosslinkable layer of the laminate and subsequent development of the relief by washing out of the unexposed non-crosslinked areas of the photo-crosslinkable layer.

Relief plates for flexographic printing and laminates for the production of such printing plates are known and are described, for example, in German Published Applications Nos. 2,115,373; 2,138,582; 2,215,090; and 2,223,808. The laminates in general consist of a photo-crosslinkable layer of a mixture of an elastomer with photo-polymerizable monomers, firmly bonded to a base such as a plastics film or a sheet of aluminum, if necessary by means of a thin layer of adhesive. The relief printing plates manufactured therefrom are, however, unsatisfactory for some requirements since they are frequently too hard and exhibit insufficient flexibility and inadequate solvent resistance toward some printing inks.

It is an object of the present invention to provide laminates for the manufacture of relief printing plates which swell less in conventional printing ink solvents, can be readily processed without undergoing deformation which might impair register, compensate for variations in the thickness of the printing stock and press tolerances, and give good printed copies even when the relief layer is relatively hard.

We have found that relief plates for flexographic printing have the desired advantages if they consist essentially of:

A. A base (U) which if from 0.5 to 6 mm, preferably from 1 to 3 mm, thick and consists of an elastomeric material which has a modulus of elasticity (measured according to German Standard Specification (DIN) 53,457) of from 10 to 200 kg/cm$^2$, preferably from 25 to 100 kg/cm$^2$, B. an intermediate layer Z which is firmly bonded to the base, if necessary with the aid of a thin layer of adhesive $H_1$, is from 5 to 500$\mu$, preferably from 10 to 200$\mu$, thick, has a modulus of elasticity of from $1 \times 10^3$ to $2.1 \times 10^6$, preferably from $5 \times 10^3$ to $2.1 \times 10^6$, kg/cm$^2$, is insoluble in the solvent used to develop the relief, in the printing ink solvents and in the constituents of the layer P used to produce the relief, and is impermeable or only very slightly permeable to these solvents, C. a relief layer P' which is firmly bonded to the intermediate layer Z, if necessary with the aid of a thin layer of adhesive $H_2$, and is from 200 to 3,000$\mu$, especially from 300 to 2,000$\mu$, thick and consists essentially of a mixture of (P1) from 50 to 99, especially from 70 to 90, percent by weight of an elastomer, and (P2) from 1 to 50, especially from 10 to 30, percent by weight of a photopolymerizable olefinically unsaturated monomer which, prior to photo-crosslinking, is substantially compatible with the elastomer, which mixture has been crosslinked by irradiation with actinic light, the relief layer P' having a modulus of elasticity of from 30 to 2,000, preferably from 30 to 500, kg/cm$^2$, which is equal to or greater than that of the layer U, and D. an optional non-tacky outer layer $S_1$ for the base U, which layer $S_1$ consists essentially of a polymer and is from 0.1 to 20$\mu$ thick, and if the neutral surface of the relief printing plate (i.e. the common neutral surface of the laminated layers $S_1$, U, $H_1$, Z, $H_2$ and P') lies in the intermediate layer Z or at a distance from the intermediate layer Z which does not exceed 10% of the thickness of the layer U or P'.

A further object of the invention is to provide laminates for the manufacture of relief plates for flexographic printing, which consist essentially of:

A. A base (U) which is from 0.5 to 6 mm, preferably from 1 to 3 mm, thick and consists of an elastomeric material which has a modulus of elasticity (measured according to DIN 53,457) of from 10 to 200 kg/cm$^2$ and preferably from 25 to 100 kg/cm$^2$, B. an intermediate layer Z which is firmly bonded to the base, if necessary with the aid of a thin layer of adhesive $H_1$, is from 5 to 500$\mu$, preferably from 10 to 200$\mu$, thick, has a modulus of elasticity of from $1 \times 10^3$ to $2.1 \times 10^6$, preferably from $5 \times 10^3$ to $2.1 \times 10^6$, kg/cm$^2$, is insoluble in the developer used, in the production of the relief, for washing out the unexposed areas of layer P, in the printing ink solvents and in the constituents of the layer P, and is impermeable or only very slightly permeable to those solvents, C. a photo-crosslinkable layer P which is firmly bonded to the intermediate layer Z, if necessary with the aid of a thin layer of adhesive $H_2$, and is from 200 to 3,000$\mu$, especially from 300 to 2,000$\mu$, thick and consists essentially of a mixture of (P1) from 50 to 99, especially from 70 to 90, percent by weight of an elastomer, and (P2) from 1 to 50, especially from 10 to 30, percent by weight of a photopolymerizable olefinically unsaturated monomer which is substantially compatible with the elastomer, which mixture can be photo-crosslinked by irradiation with actinic light, with the proviso that in the unexposed state the layer P is soluble in a developer solution in which the portions of the layer P' which have been photo-crosslinked by irradiation with actinic light are no longer soluble, and that these portions of the layer P' have a modulus of elasticity of from 30 to 2,000, preferably from 30 to 500, kg/cm$^2$, which is equal to or greater than that of layer U, D. an optional non-tacky outer layer $S_1$ for the base U, which layer $S_1$ consists essentially of a polymer and is from 0.1 to 20$\mu$, especially from 0.2 to 10$\mu$, thick, and E. an optional non-tacky outer layer $S_2$ for the photo-crosslinkable layer P, which layer $S_2$ transmits actinic light, consists essentially of a polymer and is from 0.1 to 20$\mu$, especially from 0.2 to 10$\mu$, thick, and the common neutral surface of the laminated layers $S_1$, U, $H_1$, Z and $H_2$ and of the layer P in the photo-crosslinked state (layer P') lies in the intermediate layer Z or at a distance from the intermediate layer Z which does not exceed 10% of the thickness of the layer U or P.

In an advantageous embodiment of the laminate of the invention, the outer layer $S_2$ is covered with a protective cover sheet SS which can be peeled off.

The relief printing plates are advantageously transparent to visible light after they have been exposed and developed, so as to facilitate positioning of the plate on the plate cylinder. The laminates are preferably also transparent to the active actinic light (wavelength: about 320 to 450μ), so that it is possible to pre-expose the photo-crosslinkable layer P from the back, in the conventional way.

Figure 2:
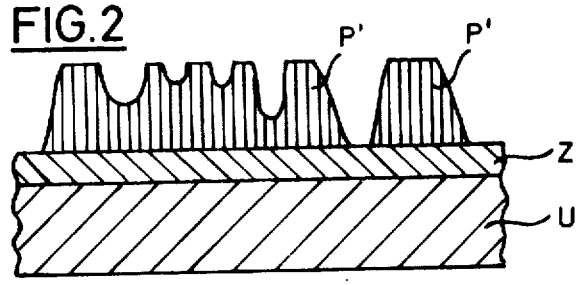
Figure 3:
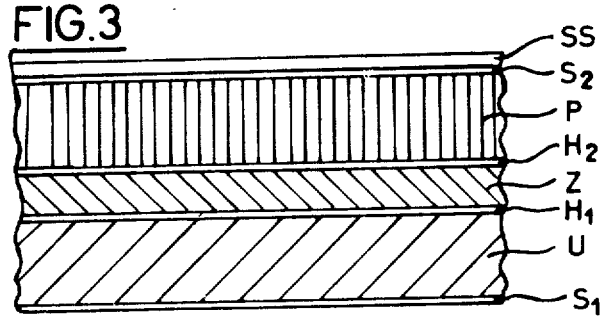
Figure 4:
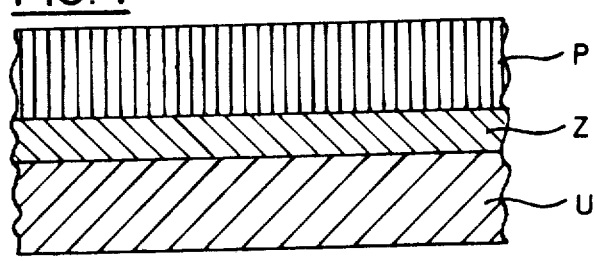

Advantageous embodiments of relief printing plates and laminates according to the invention are shown in FIGS. 1 to 4, in which the designations correspond to those used in the text.

The laminates according to the invention differ from known plates used for the same purpose in that they have, between a relatively soft elastomeric base U which has a modulus of elasticity in the stated range, which is equal to or less than that of the layer P in the exposed and developed state, i.e. of the relief layer P', and the relief layer P' used for printing, a dimensionally stable, relatively hard intermediate layer Z which acts as a barrier and stabilizing layer. The relief printing plates and laminates according to the invention have a large number of advantages, amongst which may be mentioned:

As a result of the presence of the dimensionally stable intermediate layer Z, the neutral surface of the plate lies in the intermediate layer Z or near the boundary thereof, in one of the adjacent layers, but under no circumstances should the distance between the neutral surface and the boundary of the intermediate layer Z be more than 10% of the thickness of adjacent layer U or P (P'). Preferably, the neutral surface lies in the intermediate layer Z. The dimensionally stable intermediate layer Z makes possible substantial variation of the hardnesses of the relief layer P' and the base U without the relief printing plates producing distorted images and errors in register. The hardness of the relief layer P' produced from the layer P can be substantially matched to the surface roughness of the printing stock. The base U provides a sufficiently resilient support for the relief layer P' and thus ensures that variations in the thickness of the printing stock and press tolerances are compensated for. There is no doubt that, without the intermediate stabilizing layer Z, such a substantial variation of the hardnesses of the relief layer P' and the base U would not be possible.

The intermediate layer Z furthermore substantially prevents concave warping of the printing areas of the relief layer P' produced by photo-crosslinking, which would otherwise occur if no intermediate layer Z were present and only a resilient base were employed. The intermediate layer Z of the laminate according to the invention also largely absorbs the shrinkage stresses resulting from the photopolymerization and evaporation of the solvent in the developer solution, and enables the printing plate to conform perfectly to the plate cylinder.

The laminates according to the invention can be exposed on rotary exposure equipment without difficulty without substantial longitudinal distortion of the printing surface occurring when the printing plates are mounted.

The intermediate layer Z furthermore brings about a distinct reduction in the swelling of the relief printing plates according to the invention, since, as a result of its presence, it is not the entire printing plate but only the upper relief layer P' which comes into contact with the printing ink solvents which may cause swelling. As a result, there is practically no distortion of lines and image areas. The accuracy of register of the resulting relief printing plates is astonishingly good, which is of particular importance in multicolor printing.

Relief printing plates produced from the laminates according to the invention give excellent reproduction of solids, halftones and lines.

The laminates according to the invention furthermore cut costs since there is no need for the additional elaborate gluing and grinding steps and other finishing steps.

Examples of suitable elastomeric materials for the base U are natural rubber, polybutadienes, butadiene-acrylonitrile copolymers, butadiene-styrene copolymers, silicone rubber, polysulfide rubber, vinylidene chloride/hexafluoropropylene copolymers, isoprene/styrene and butadiene/styrene block copolymers and especially polyurethane elastomers, which may be obtained by conventional methods from high molecular weight polyhydroxy compounds, such as polyesters or polyethers, optionally together with low molecular weight polyols, and polyisocyanates, especially diisocyanates. Reference may be made, for example, to the information given by Saunders and Frisch, "Polyurethanes", Part II, Chapter IX, Interscience Publishers Inc., New York, 1964. The materials used for the layer U should advantageously lend themselves to the production of layers of uniform thickness, for example, by casting and curing in moulds or heated centrifuges or in the case of thermoplastics by, for example, calendering. It is also possible to produce the layer U from foam-like materials or foamed plastics, provided they exhibit the appropriate resilience and do not act as a sponge for the printing inks or developer solutions, i.e. do not absorb these. Preferably, the materials of layer U are insoluble or only difficultly soluble in the solvents used to wash out layer P.

Suitable materials for the intermediate layer (barrier layer) Z are plastics films, metal foils and crosslinked surface coatings, which can also be reinforced with fabrics, for example textile materials or glass fiber cloth. Thus, intermediate layers Z can be produced by impregnating glass fiber cloth with crosslinkable polymers or monomers or mixtures thereof, for example with unsaturated polyester resins, and crosslinking these before or during shaping. The intermediate layers Z should in every case be from about 5 to 500μ, and especially from 10 to 200μ, thick and have a modulus of elasticity in the abovementioned range. Furthermore, the intermediate layers Z should be insoluble in the solvent or solvent mixtures used to develop the relief after exposure of the layer P, and in the organic solvents usually present in printing inks, and should swell as little as possible in these ink and developer solvents, and have as low a permeability to them as possible. Typical solvents of this kind are alcohols such as ethanol and isopropanol, esters such as ethyl acetate, hydrocarbons and ketones such as acetone and methyl ethyl ketone.

Preferably, polymer films, and especially polyester films, such as polyethylene terephthalate films, are used as the intermediate layer Z. The preferred intermediate layers (barrier layers) Z are those which are transparent to visible light so as to facilitate positioning of the plates on the plate cylinder, and especially those which also transmit the actinic light which activates the photo-crosslinkable layer P, particularly the photoinitiator contained therein (in general light having a wavelength down to about 320μ) and thus permit, for example, pre-exposure of the layer P from the rear of the plate.

Materials which can be used for the photo-crosslinkable layer P are conventional elastomer-monomer mixtures for photopolymer flexographic printing plates, provided they, in the photo-crosslinked state after exposure, do not dissolve in the developer and have a modulus of elasticity equal to, and preferably greater than, that of the layer U, i.e. have a modulus of elasticity of from 30 to 2,000, preferably from 30 to 500, kg/cm². This can easily be ascertained by a few preliminary experiments. A large number of the elastomeric materials mentioned above for the layer U or mixtures thereof can be used as elastomers for the layer P, provided they are soluble in the developer solution. Very suitable materials are elastomeric butadiene or isoprene block copolymers and elastomeric polyether urethanes and polyester urethanes, particularly polyurethane elastomers which have been produced by reacting an aliphatic saturated polyester glycol of molecular weight approximately from 400 to 4,000 with an organic diisocyanate and optionally an aliphatic diol with 2 to 10 C atoms as chain extender.

The monomers used in the layer P should be substantially compatible with the polymeric material used, i.e. they should not separate out even after the mixture has stood or the laminate has been stored for prolonged periods, and should be readily photopolymerizable by irradiation with actinic light in the presence of photoinitiators. Examples of very suitable monomers are the acrylates, especially the diacrylates and polyacrylates, and the corresponding methacrylates of aliphatic or cycloaliphatic diols and polyols generally having 2 to 20 carbon atoms, for example butanediol-1,4-diacrylate, the practically isocyanate-free reaction products of polyisocyanates, especially aliphatic diisocyanates, of 6 to 36 carbon atoms and acrylic or methacrylic acid esters which have a hydroxyl group in the alcohol radical, such as butanediol-1,4-monoacrylate, and N-vinyl compounds, especially N-vinylpyrrolidone.

The layer P furthermore usually contains a photoinitiator such as benzoin or a benzoin derivative, for example benzoin methyl ether or benzoin isopropyl ether, in amounts of from 0.01 to 10, especially in amounts of from 0.01 to 5, percent by weight. The layer P can also contain other conventional additives such as thermal polymerization inhibitors, for example p-methoxyphenol, hydroquinone and salts of N-nitrosocyclohexyl-hydroxylamine, dyes and plasticizers (for improving the processability of the mixture used for layer P).

It is frequently advantageous to provide the photo-crosslinkable layer P with a firmly adhering thin non-tacky outer layer $S_2$, which may for example consist of a polymer which forms hard, non-tacky, transparent and tear-resistant films, for example a polyamide or copolyamide which is soluble in the developer, or of a mixture of such a polymer with a small amount ( 10 percent by weight) of a photopolymerizable monomer, a photoinitiator and an optional inhibitor.

In the production of a relief printing plate from the laminate, the outer layer $S_2$ enables the negative to be laid flat on the plate without the formation of bubbles; this is sometimes not possible in the absence of the outer layer $S_2$ because of the tackiness of the layer P. In the development of the exposed areas of the layer P to form the relief layer P', the outer layer $S_2$ is removed together with the non-crosslinked areas of the layer P if it has not already been removed.

Furthermore, it is frequently advantageous to provide the outer layer $S_2$ with a protective cover sheet which can be peeled off, such as a polyester film; this protective cover sheet can also be applied to the layer P conjointly with the outer layer $S_2$. In general, the protective cover sheet SS is peeled off prior to the imagewise exposure of the layer P, whereas the outer layer $S_2$ usually remains on the layer P during exposure.

In many cases it has also proved of value if the elastomeric base U carries, on the side facing away from the intermediate layer Z, an outer layer $S_1$ which is from 0.1 to 20, especially from 0.2 to 10,$\mu$ thick, and is based on a non-tacky polymer. Frequently, the same polymers that are used for the production of the outer layer $S_2$ may be employed for this layer $S_1$. The outer layer $S_1$ should also preferably transmit actinic light.

The layers U, Z and P (relief layer P') are firmly bonded to one another. When suitable polymeric materials, and especially polymeric materials of similar chemical structure, are used, it is not difficult to achieve a firm bond, for example by lamination in the presence of suitable organic solvents which dissolve the surface of the layers. However, it is frequently necessary to produce a firm bond between the individual layers by applying a thin layer of adhesive to one or both sides and firmly gluing the layers together, as a result of which thin layers of adhesive $H_1$ (between the layers U and Z) and $H_2$ (between the layers Z and P (relief layer P')) are produced, though these are less than 100$\mu$ thick and preferably less than 30$\mu$ thick. Commercially available one-component and two-component adhesives can be used for these layers, the nature of the adhesives depending on the type of materials or polymers used for the layers U and Z, and Z and P. Adhesives which are frequently used are commercially available two-component adhesives bases on polyurethanes and on polychloroprene, which can be applied, in appropriate thicknesses, by coating or casting, to the layers which are to be bonded together.

When selecting the hardness and thickness of the individual layers of the laminates according to the invention, it should be borne in mind that the neutral surface of the relief plate, i.e. the common neutral surface of the laminated layers $S_1$ (where present) + U + $H_1$ (where present) + Z + $H_2$ (where present) + the layer P in the photo-crosslinked state (layer P'), should lie in the intermediate layer Z, or in its immediate vicinity, following exposure of the entire surface of layer P. The position of the neutral surface can easily be calculated by conventional method from the thickness and hardness of the individual layers.

Relief printing plates which have proved particularly suitable are those in which the neutral surface lies directly in the intermediate layer Z, the base U is from 1,000 to 5,000$\mu$ thick and has a modulus of elasticity of from 15 to 100 kg/cm², the intermediate layer is from 20 to 125$\mu$ thick and has a modulus of elasticity of from 2.5 × 10⁴ to 10⁵ kg/cm² and the photo-crosslinked relief layer P' is from 400 to 1,000$\mu$ thick and has a modulus of elasticity of from 30 to 500 kg/cm².

The following Examples illustrate two very suitable embodiments of the laminates according to the invention. The parts and percentages mentioned therein are by weight.

EXAMPLE 1

The photo-crosslinkable layer P of the laminate consists of about 80 parts of a commercially available, thermoplastically processable, polyurethane elastomer which is free from isocyanate groups, has been produced from an adipic acid/ethylene glycol polyester, diphenylmethane diisocyanate and ethylene glycol and is soluble in ketones or tetrahydrofuran, about 10 parts of butanediol-1,4 diacrylate and 10 parts of a reaction product, free from isocyanate groups, of 2 mols of butanediol-1,4 monoacrylate and 1 mol of hexamethylene diisocyanate, and about 1 part of benzoin isopropyl ether. The layer P is about 0.7 mm thick and, in the exposed photo-crosslinked state, has a modulus of elasticity of 350 kg/cm$^2$.

The layer P is firmly bonded by means of a commercially available polyurethane adhesive (adhesive layer H$_2$) to a 75$\mu$ thick polyethylene terephthalate film (modulus of elasticity 4.5 × 10$^4$ kg/cm$^2$) acting as intermediate layer Z. The surface of the photo-crosslinkable layer P is covered with an 0.8$\mu$ thick outer layer (S$_2$) of a soluble polyamide and this in turn is covered with a 125$\mu$ thick polyester film acting as the removable protective cover sheet SS, which is peeled off before the imagewise exposure. The intermediate layer Z is bonded, again by means of a commercially available polyurethane adhesive (adhesive layer H$_1$ about 10$\mu$ thick), to a 2 mm thick base U consisting of a polyurethane elastomer produced from a polyester and 2,4-toluylene diisocyanate, the modulus of elasticity of the layer U being 25 kg/cm$^2$.

EXAMPLE 2

The laminate has the same construction as in Example 1, except that the base U consists of a 3 mm thick transparent layer of a commercially available self-adhesive styrene/isoprene block copolymer having a modulus of elasticity of 19 kg/cm$^2$.

We claim:

1. A laminate for the manufacture of relief plates for flexographic printing, consisting essentially of:
  A. a base (U) which is from 0.5 to 6 mm thick and consists of an elastomeric material which has a modulus of elasticity of from 10 to 200 kg/cm$^2$,
  B. an intermediate layer (Z) which is firmly bonded to the base, is from 5 to 500$\mu$ thick, has a modulus of elasticity of from 1 × 10$^3$ to 2.1 × 10$^6$ kg/cm$^2$, is insoluble in the developer used, in the production of the relief, for washing out the unexposed areas of the layer P, in the constituents of the layer P used to produce the relief and in the printing ink solvents, and is impermeable or only very slightly permeable to these solvents,
  C. a photo-crosslinkable layer (P) which is firmly bonded to the intermediate layer Z, and is from 200 to 3,000$\mu$ thick and consists essentially of a photo-crosslinkable mixture of
    P1. from 50 to 99 percent by weight of an elastomer, and
    P2. from 1 to 50 percent by weight of a photopolymerizable olefinically unsaturated monomer which is substantially compatible with the elastomer,
  with the proviso that in the unexposed state the layer P is soluble in a developer solution in which said layer P which has been exposed and photo-crosslinked (P1) is no longer soluble, and that the layer P' has, in the exposed and photo-crosslinked state, a modulus of elasticity of from 30 to 2,000 kg/cm$^2$ which is equal to or greater than that of the layer U, and
  D. the neutral surface of the laminated layers u, x, and of the layer P in the photo-crosslinked state (layer P') after exposure of the entire surface of layer P lying in the intermediate layer Z or at a distance from the intermediate layer Z which does not exceed 10% of the thickness of the layer U or P.

2. A laminate as set forth in claim 1 wherein said intermediate layer (Z) is firmly bonded to said base with a thin layer of adhesive (H$_1$).

3. A laminate as set forth in claim 1 wherein said photo-crosslinkable layer (P) is firmly bonded to said intermediate layer (Z) with a thin layer of adhesive (H$_2$).

4. A laminate as set forth in claim 1 wherein said base (U) is provided with a non-tacky outer layer S$_1$, which layer consists essentially of a polymer and is from 0.1 to 20$\mu$ thick.

5. A laminate as set forth in claim 1 wherein said photo-crosslinkable layer (P) is provided with a non-tacky outer layer S$_2$, which layer transmits actinic light, consists essentially of a polymer, and is from 0.1 to 20$\mu$ thick.

6. A laminate as set forth in claim 5 wherein the layer S$_2$ is provided with a protective cover sheet.

* * * * *